(12) United States Patent
Minneman et al.

(10) Patent No.: US 7,352,601 B1
(45) Date of Patent: Apr. 1, 2008

(54) USB FLASH MEMORY DEVICE

(76) Inventors: Michael Paul Minneman, 1275 W. 13th St., Broomfield, CO (US) 80020; Michael Crawford, 5670 W. 115th Ct., Westminister, CO (US) 80020

( * ) Notice: Subject to any disclaimer, the term of this patent is extended or adjusted under 35 U.S.C. 154(b) by 169 days.

(21) Appl. No.: 10/997,515

(22) Filed: Nov. 24, 2004

Related U.S. Application Data

(60) Provisional application No. 60/525,046, filed on Nov. 24, 2003.

(51) Int. Cl.
  *H01R 13/66* (2006.01)
  *H01R 24/00* (2006.01)
  *H01R 33/00* (2006.01)

(52) U.S. Cl. .................. 365/51; 439/620.01; 439/660; 439/638; 365/185.05; 365/63

(58) Field of Classification Search .................. 365/51, 365/63, 185.05; 710/305, 311; 439/660, 439/638, 518, 620.01
See application file for complete search history.

(56) References Cited

U.S. PATENT DOCUMENTS

| | | | |
|---|---|---|---|
| 4,323,979 A * | 4/1982 | Johnston | 361/684 |
| 5,129,143 A * | 7/1992 | Wei et al. | 29/885 |
| 5,319,591 A * | 6/1994 | Takeda et al. | 365/63 |
| 5,422,855 A | 6/1995 | Eslick et al. | |
| 5,650,969 A * | 7/1997 | Niijima et al. | 365/200 |
| 5,928,347 A | 7/1999 | Jones | |
| 6,148,354 A | 11/2000 | Ban et al. | |

(Continued)

OTHER PUBLICATIONS

Toshiba Preliminary SD-Mxxx Series, SD - Mxxx Series, SD Memory Card, Jul. 25, 2002, pp. 1-13, (description and features).

(Continued)

*Primary Examiner*—J. H. Hur
(74) *Attorney, Agent, or Firm*—Renner, Otto, Boisselle & Sklar, LLP

(57) ABSTRACT

A memory device for interconnection with a Universal Serial Bus (USB) Series A type receptacle of an electronic device includes a housing wherein the housing is largely rectangular, with the width and height of a USB Series A plug standard housing; a connector within the housing, electrical terminals in the housing; the housing and terminals of a form to connect with a USB Series A receptacle of an electronic device; and a data memory and a controller within the housing. The memory device may be used in combination with a portable computing device or peripheral or with a cell phone, gps or other electrical or electronic device that includes a receptacle to house the memory device of the type disclosed herein, wherein the memory device is largely within the electrical or electronic device. A method of transporting data between a peripheral and a computer (or processor) includes storing data in a portable memory device directly using a computer or a peripheral; transporting the portable memory device to the other of such a computer or a peripheral; and delivering data from the portable memory device directly to such other computer or peripheral, said delivering being while the portable memory device is largely within the peripheral during use of the peripheral.

68 Claims, 10 Drawing Sheets

U.S. PATENT DOCUMENTS

| | | | | |
|---|---|---|---|---|
| 6,260,087 B1* | 7/2001 | Chang | .................... | 710/100 |
| 6,398,587 B1 | 6/2002 | Chen et al. | | |
| 6,588,662 B1 | 7/2003 | Hu | | |
| 6,733,329 B2* | 5/2004 | Yang | .................... | 439/518 |
| 6,829,672 B1* | 12/2004 | Deng et al. | ............. | 711/103 |
| 6,854,984 B1* | 2/2005 | Lee et al. | ............... | 439/79 |
| 7,069,370 B2* | 6/2006 | Sukegawa et al. | ........... | 710/305 |
| 2001/0021965 A1* | 9/2001 | Yokota et al. | ............. | 711/163 |
| 2005/0105346 A1* | 5/2005 | Shih | ....................... | 365/200 |

OTHER PUBLICATIONS

Toshiba TC58NS512ADC Tentative Toshiba MOS Digital Integrated Circuit Silicon Gate CMOS, Mar. 5, 2003, pp. 1-43 (description and features).

Toshiba Preliminary THNCFxxxMBA/BAI Series, Tentative Toshiba Small Form Factor Card, May 25, 2002, pp. 1-47, (description and features).

Envoy Data Corporation, PC Cards, p. 1, Sep. 9, 2003, http://www.envoydata.com/pccardpage1.htm.

* cited by examiner

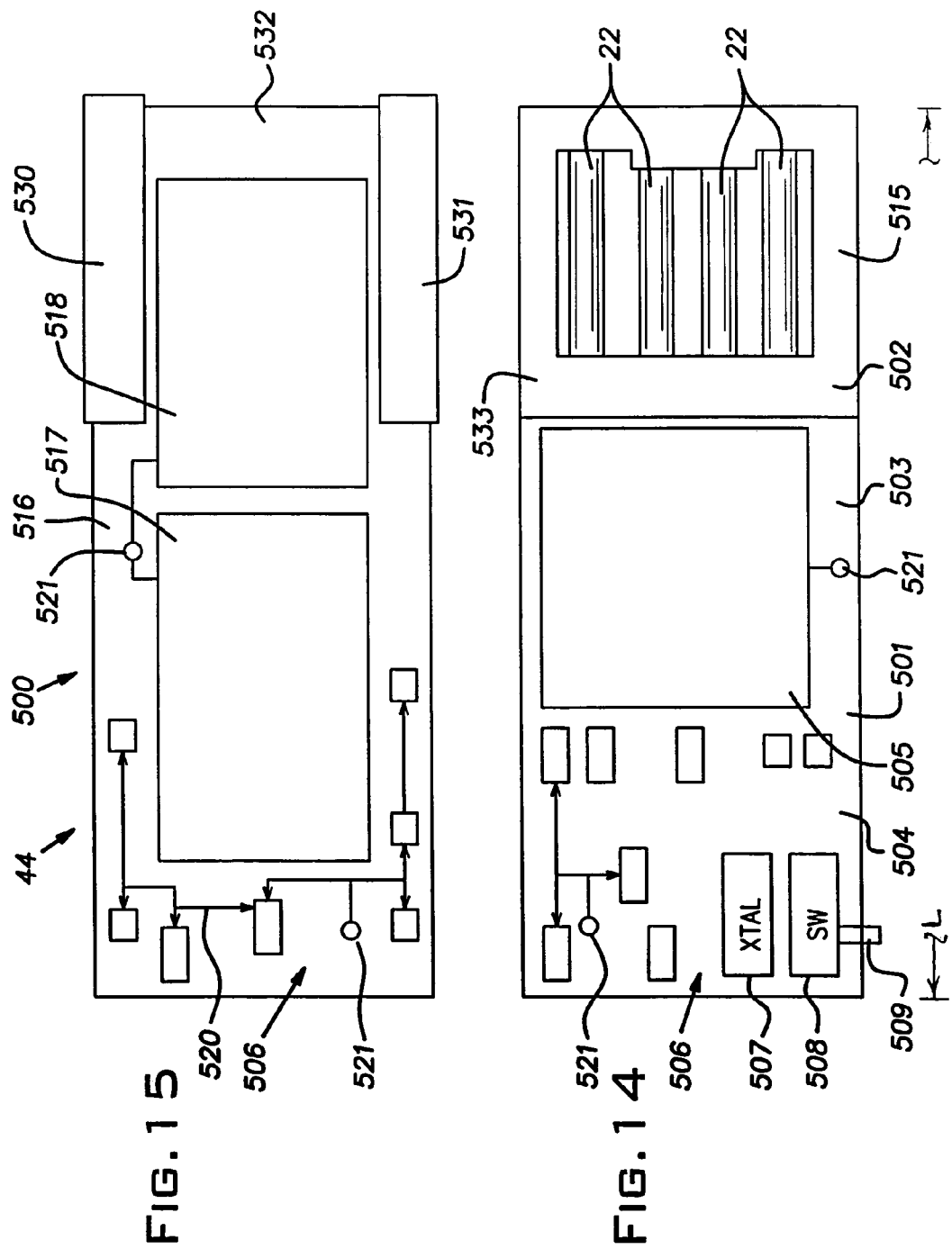

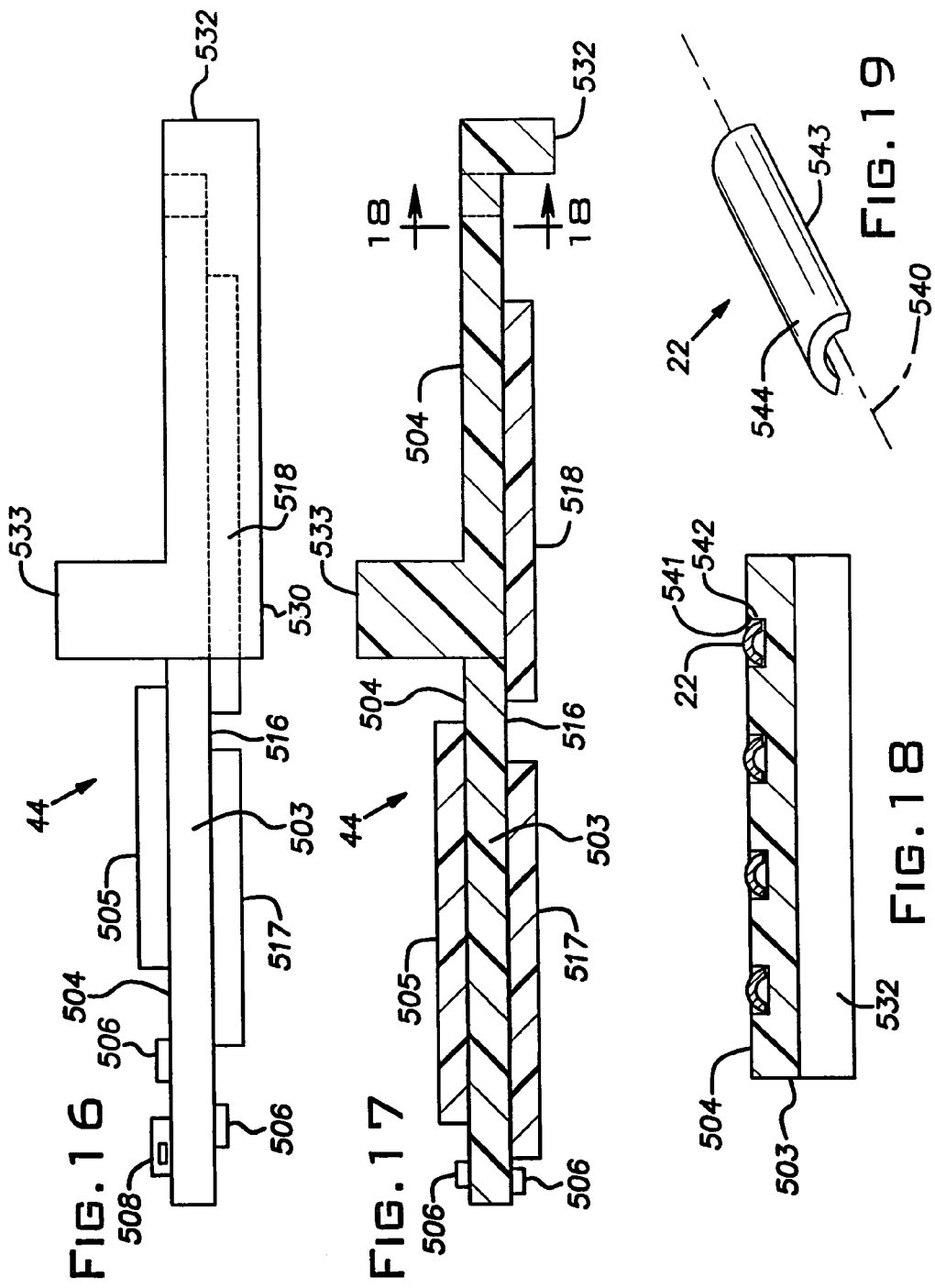

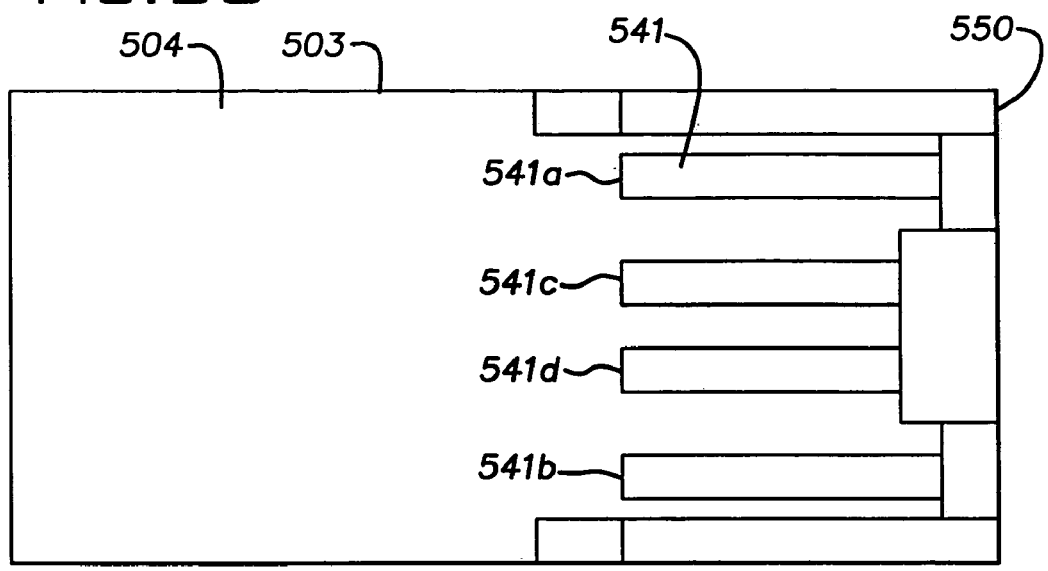
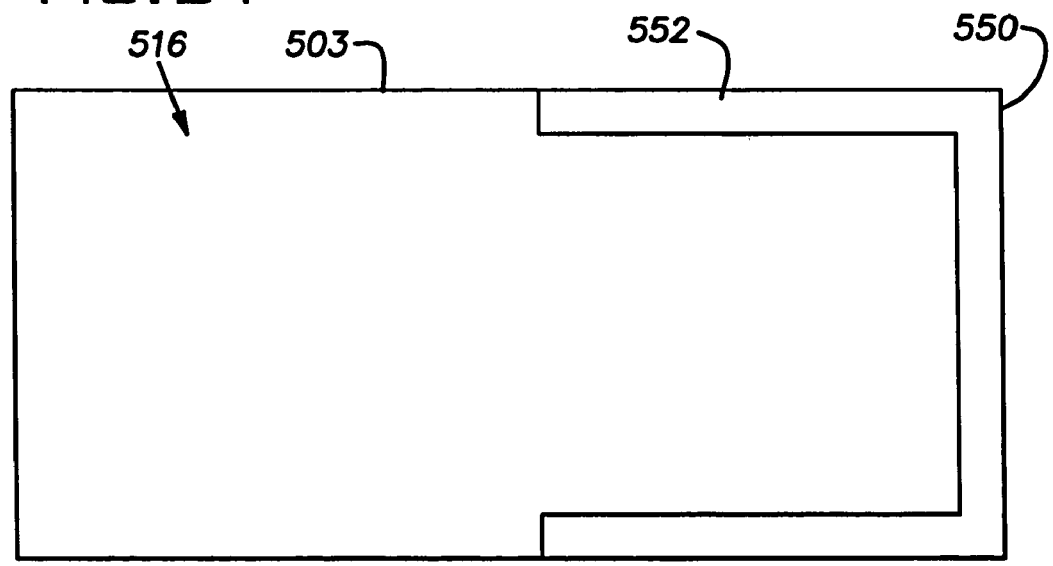

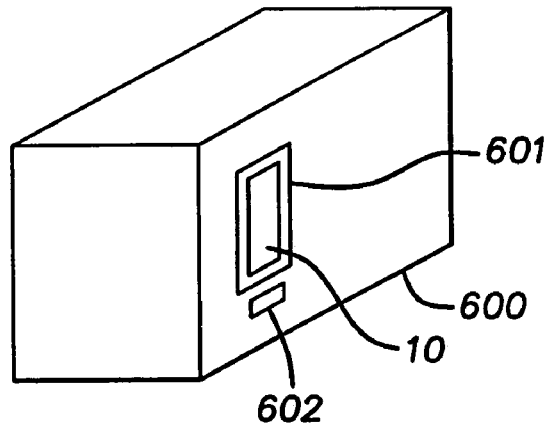
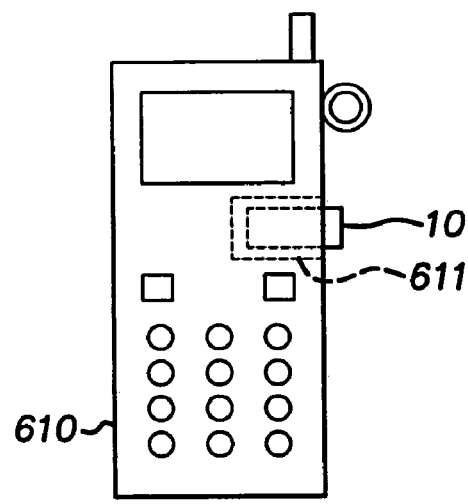
FIG. 22    FIG. 23
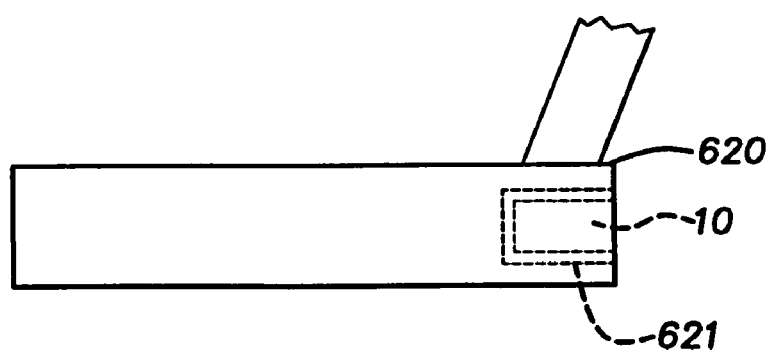
FIG. 24

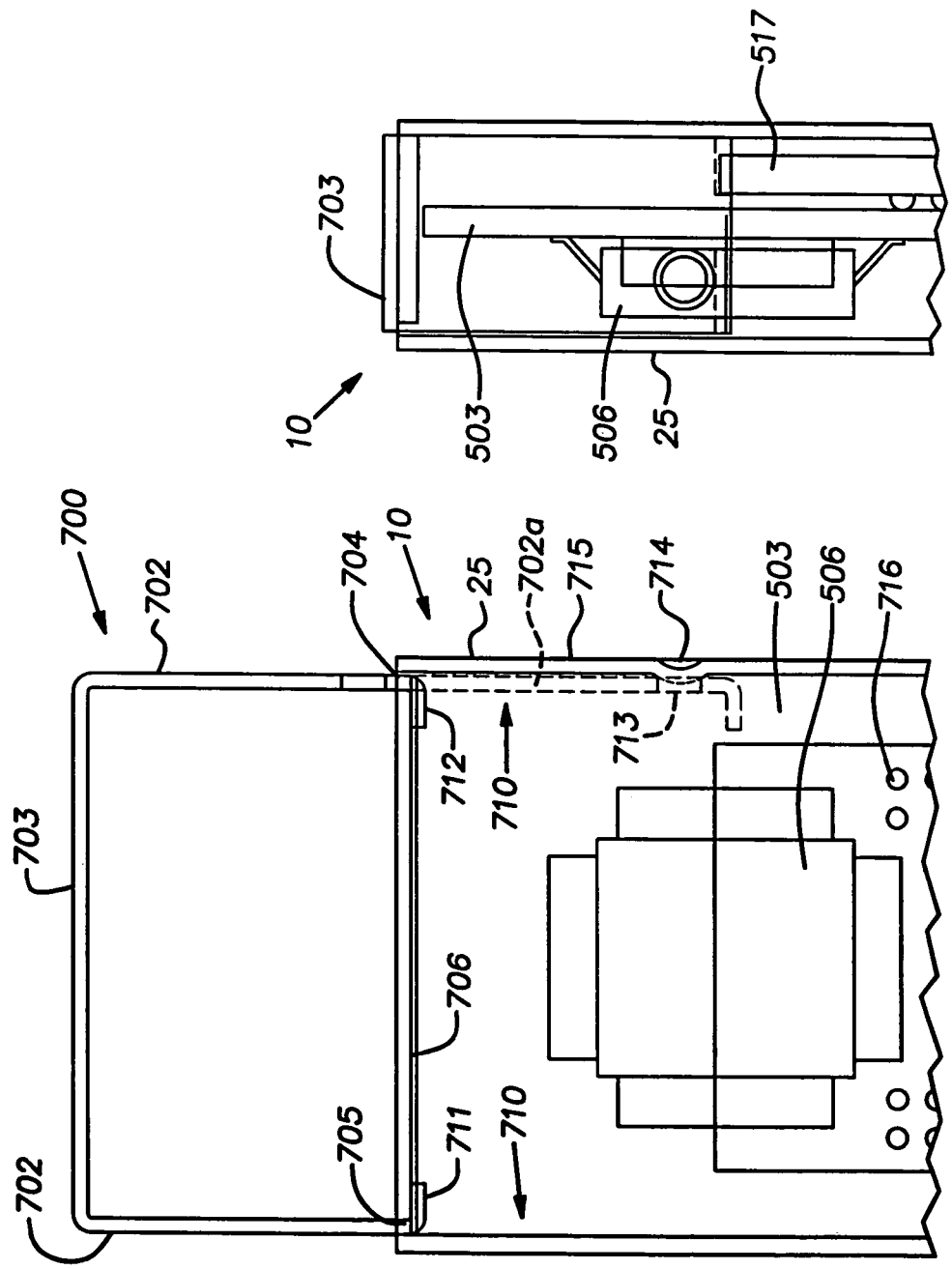

USB FLASH MEMORY DEVICE

CROSS REFERENCE TO RELATED APPLICATION

This patent application claims priority to United States Provisional patent application entitled "USB FLASH MEMORY DEVICE" filed on Nov. 24, 2003 and assigned Ser. No. 60/525,046 which is incorporated herein by reference.

TECHNICAL FIELD

The present invention relates generally, as indicated, to memory devices and methods, and more particularly, to a miniaturized USB type universal memory system and method.

BACKGROUND

Removable, transportable memory is an increasingly popular way to store data such as text, images, program code and the like on peripheral devices, such as those used in connection with computers, other electrical and electronic apparatus, and the like, and to transport data from one device to another. Exemplary devices that can use transportable memory include a variety of portable electronic devices, such as digital still cameras, digital movie cameras, personal digital assistant (PDAs), printers, portable digital audio players (e.g., mpeg and mp3 player), electronic devices to play movies, cell phones, home phones, car audio devices, home audio devices, game devices such as video game players, and less portable devices such as computers, printers, telephones, household appliances, and so forth. As but one example, in the field of digital photography, a digital camera is used to take a picture, and the data representing the image is stored in a memory device. The data stored in such a camera memory device usually is transferred to a computer or to a printer for viewing, editing and/or printing of the picture that had been taken by the digital camera. Data transfer is typically accomplished by creating a data connection between devices, or by physical transportation of a removable memory from one device to another device. Many different types of removable memory devices are available currently, many of which are incompatible with each other. Removable memory is referred to by a variety of names such as "digital media", "digital media cards", "flash memory cards", as well as others. Several exemplary memory devices currently existing are those referred to as Smart Media Card, MultiMedia Card, Memory Stick, D-picture Card (sometimes referred to as xD-picture Card) and Compact Flash. In general, these devices implement a quantity of non-volatile memory such as Flash EEPROM memory as well as the circuitry, logic, and physical interconnections necessary to read and write data. Even though these various memory cards perform essentially the same function, because of the variety of implementations, a memory card that operates in one device is often physically and/or electrically incompatible with another device.

The physical dimensions of the aforementioned respective memory devices are different. Removable media is generally card-shaped in that it is notably thinner in one dimension as compared to the other two dimensions. Typically these cards have at least one dimension that is several times, e.g., ten times, smaller than either of the other dimensions which creates a distinct, card like appearance. However, this arrangement is difficult to manufacture and leads to breakage due to bending. Also, the variation in physical dimensions prevents exchange of digital memory between devices. For example, the Smart Media Card is wider and thinner than the MultiMedia Card. As a result, a device with a port that accepts a specific type of memory device is unable to accept any other type of memory device in that port. For example, a device that has a port that accepts a Memory Stick is unable to accept a Smart Media Card. In addition, the electrical interfaces to these different cards usually are different.

Personal computers usually do not come with any built in ports for directly receiving a memory device such as those mentioned above. Therefore, such memory devices usually cannot be plugged directly into the majority of personal computers. Hence, to interface a computer with the memory device (e.g., to store data in or to retrieve data from the memory device), a special adapter that is designed to accept a particular memory device is used. Such an adapter usually includes an electrical cable and an electrical connector that may be plugged into (connected to) a standard port on the computer. These adapters are sold separately from the personal computer and usually plug into a USB port or a serial port on the personal computer. An adapter may support multiple types of memory devices, but it usually does not support all types of memory devices that are available, and new memory devices will generally not be compatible with previously built adapters. Thus, one problem with the need to use these adapters is that the user may not have the correct adapter readily available in order to access his own specific memory device. For example, a user may want to access a Smart Media Card, but he may have an adapter that only accepts a Memory Stick.

The connector arrangement used in such adapters sometimes is referred to as a termination or as an electrical termination or similar nomenclature; the combination of connector and cable sometimes is referred to as a cable termination assembly or similar nomenclature. The form factor for such connectors and/or of the housing thereof typically is a standard shape or at least the shapes are reasonably standardized to allow the connector to plug into a standard socket or port of a computer or of a peripheral device, such as a printer, external disc drive, etc., and, for example, to provide for connections to the cable to which it is attached or to a circuit board on which it is mounted. Although the shape of such connectors for connection to a computer and, thus, the form factor of such connectors at the computer connection end and/or peripheral device connection end may have been somewhat standardized, the connections made by the mentioned adapters to memory devices clearly have not been standardized, as different sizes, shapes and electrical and mechanical connection arrangements are specially designed to accommodate the respective memory devices, such as those mentioned above.

Data as used herein is defined as anything such as program code, information, or signals that may be stored or retrieved from a memory device. The data may be in digital form or in some other form. Examples of data are pictures taken from digital still cameras, movies from digital video cameras, songs downloaded from CDs, from mp3 players, or from the internet, spreadsheets from an Excel spreadsheet or a Quattro spreadsheet, databases, computer games, documents from a word processing software, and saved emails from Outlook software, as well as any other information able to be stored in a memory device.

The physical size of the actual storage medium of the previously mentioned memory devices usually is small, but in order effectively to use the storage medium, the packaging of the memory device is relatively large and bulky compared to the size of the storage medium. In addition, the adapters necessary to connect the memory device to a personal computer are relatively large and bulky and are a hassle to carry if the user is frequently mobile. For example, a tourist taking pictures of scenic places with a digital camera and carrying his laptop in order to view those pictures would also have to carry the adapter in order to view those pictures on the laptop. Forgetting to bring the adapter or bringing the wrong adapter clearly is a problem. There are USB memory devices, which are intended to be an external memory for transporting data between two computing devices, but they are large enough that they cannot reasonably be contained largely within the peripheral.

BRIEF SUMMARY

One aspect of the invention relates to a memory device for interconnection with a Universal Serial Bus (USB) Series A type receptacle of an electronic device, including a housing wherein the housing is largely rectangular, with the width and height of a USB Series A plug standard housing; a connector within the housing, electrical terminals in the housing; the housing and terminals of a form to connect with a USB Series A receptacle of an electronic device; and a data memory and a controller within the housing.

Another aspect relates to a memory device, including a circuit board; an I/O controller; a data memory; a memory controller; and an electrical connector having terminals for electrical connection to another device, wherein the terminals of the electrical connector are on the circuit board, and wherein the electrical connector includes a standard shape housing and at least part of each of the circuit board, controller, data memory, memory controller and terminals is in the housing.

Another aspect relates to a memory device able to connect directly to a peripheral and connect directly to a computer, including a data memory; a controller; and an electrical connector having terminals to connect to another device, wherein the electrical connector includes a standard shape housing.

Another aspect relates to a method of transporting data between a peripheral and a computer (or processor), including storing data in a portable memory device directly using a computer or a peripheral; transporting the portable memory device to the other of such a computer or a peripheral; and delivering data from the portable memory device directly to such other computer or peripheral, said delivering being while the portable memory device is largely within the peripheral during use of the peripheral.

Another aspect relates to a system of transporting data between a peripheral and a computer (or processor) including storing data in a portable memory device directly using a computer or a peripheral; transporting the portable memory device to the other of such a computer or a peripheral; and delivering data from the portable memory device directly to such other computer or peripheral, wherein the portable memory device utilizes a nearly universally available standard communication protocol and can fit fully within or nearly fully within the peripheral during use of the peripheral.

Another aspect relates to a method of transporting data between at least two peripherals that do not accept the same flash memory card type, including storing data in a portable memory device directly using a peripheral, while the portable memory is fully or nearly fully within the peripheral; transporting the portable memory device to another peripheral; and delivering the data from the portable memory device directly to such other peripheral.

Another aspect relates to a storage apparatus, including a memory unit for preserving data received from an electronic device; a connector (e.g. a Universal Serial Bus connector) for connecting the apparatus to an electronic device (e.g. a computer or digital camera); a communication control system between the connector and the memory unit for arranging data received from a connected electronic device through the connector and the memory unit to the desired format for transmission to the memory unit and a connected electronic device, respectively; and a casing retaining the memory unit, the communication control system, and the connector as an integral unit, the casing having a form factor in at least two directions comparable to the form factor in the same two directions of a standard electrical connector casing.

Another aspect relates to a storage apparatus, including a connector (e.g. a Universal Serial Bus connector) for connecting the apparatus to an electronic device (e.g. a computer or digital camera) and for being a medium for data sent between the apparatus and the electronic device; and at least one memory unit for preserving data received from the connected electronic device and for later retrieval of the data by the electronic device or another electronic device; and a communication control system between the connector and the memory unit for arranging data received from the connected electronic device through the connector and the memory unit to the desired format for transmission to the memory unit and the connected electronic device respectively; and wherein the connector includes a housing containing at least part of the memory unit and at least part of the communication control system, and wherein the storage apparatus is small enough to fit fully or nearly fully within at least one of the electronic devices, and wherein the dimensions of the storage apparatus housing are the same in at least two dimensions as a standard connector.

Another aspect relates to an electronic memory device, including a relatively non-volatile memory, and a housing having electrical conductivity for at least one of grounding, guarding and static discharge, the memory being at least partly in the housing, the housing having a form factor to plug directly into a connector port of an electronic device, and the housing fitting either completely or nearly completely into some electronic devices.

Another aspect relates to a portable computing device or peripheral including a receptacle to house a memory device of the type disclosed herein, wherein the memory device is largely within the portable computing device.

To the accomplishment of the foregoing and related ends, the invention comprises the features hereinafter fully described and particularly pointed out in the claims. The following description and the annexed drawings set forth in detail certain illustrative embodiments of the invention. These embodiments, however, are merely indicative of a few of the various ways in which the principles of the invention may be employed. Other objects, advantages and novel features of the invention will become apparent from the following detailed description of the invention when considered in conjunction with the drawings.

Also, although various features are illustrated and described with respect to embodiments and arrangements in the several figures, it will be appreciated that features shown and/or described with respect to a given embodiment, arrangement or illustration may be used in other(s) of the embodiments or arrangements disclosed herein and equivalents thereof.

Although the invention is shown and described with respect to one or more preferred embodiments, it is obvious that equivalents and modifications will occur to others skilled in the art upon the reading and understanding of the specification. The present invention includes all such equivalents and modifications, and is limited only by the scope of the claims.

BRIEF DESCRIPTION OF THE DRAWINGS

In the annexed drawings:

FIG. 14 is a schematic top view of the circuit board and components subassembly of a memory device in accordance with the present invention;

FIG. 15 is a schematic bottom view of the circuit board and components subassembly;

FIG. 16 is a side elevation view of the circuit board and components subassembly;

FIG. 17 is a side section view of the circuit board and components subassembly;

FIG. 18 is a section view of the front portion of the circuit board and components subassembly with terminals therein;

FIG. 19 is a schematic isometric view of a terminal;

FIG. 20 is a top view of the circuit board and components subassembly;

FIG. 21 is a bottom view of the circuit board;

FIGS. 22-24 are schematic illustrations of a radio, cellular telephone and laptop computer, respectively, with a memory device operatively positioned largely within such devices; and FIGS. 25 and 26 are fragmentary schematic top plan view and side elevation view of a memory device with a removal strap.

DESCRIPTION

In general, the present invention relates to a universal, transportable memory system that may leverage a wide installed base of standardized communication ports such as USB ports found on many computing devices (or other parts currently existing or developed in the future). Unlike prior approaches which provided specialized and proprietary memory interfaces for internal memory, the present invention provides a memory device that uses a generally available I/O interface implemented in a form factor that meets the needs of portable electronic devices. In this manner, a memory device in accordance with the present invention benefits from the rapid development and cost benefits achieved by the general purpose memory markets, while providing the benefits of portability and compactness that are advantageous for portable electronic devices.

Figure 1:
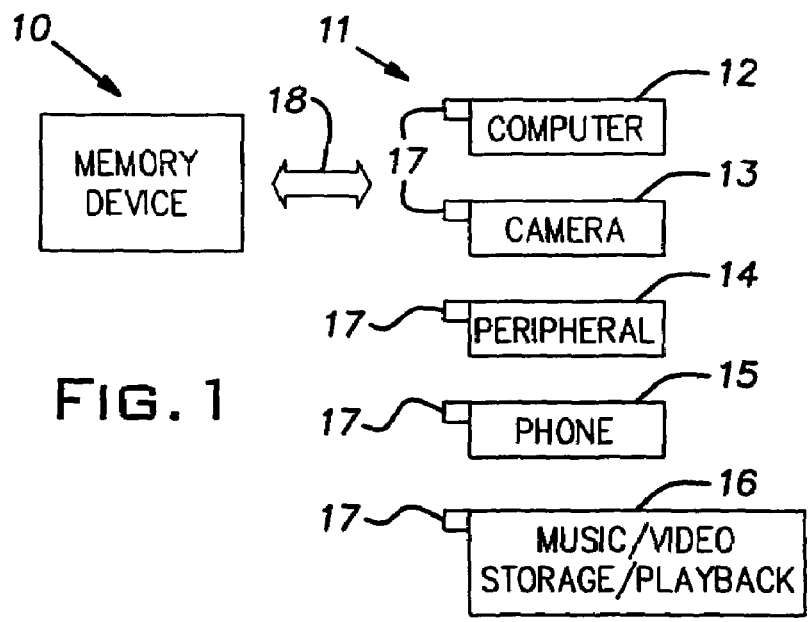
FIG. 1 is a schematic illustration of a memory device in accordance with the invention for use with a number of other electrical or electronic devices, systems, computer, peripheral device, camera, etc.

Referring, now, in detail to the drawings, wherein like reference numerals designate like parts, and initially to FIG. 1, a memory device 10 is illustrated schematically. The memory device 10 may be used to receive data, to store data, and/or to transfer or output data. The memory device 10 may be used with any one or more of a number of electrical or electronic devices or systems 11, which may provide data to the memory device and/or may receive data from the memory device. Examples of such systems or devices with which the memory device 10 may be used are illustrated schematically in FIG. 1, such as a computer 12, camera 13, other peripheral device or peripheral 14, phone 15, and music/video storage/playback device 16. The computer 12 may be a personal computer or some other type of computer, a personal digital assistant (PDA), or virtually any other electrical or electronic device of that character. The camera 13 may be, for example, a digital camera, a still digital camera, a video digital camera, or virtually any other type of camera that may be used to obtain images, for example, and from which it may be desired to transfer data representing images to another device, such as to a computer for manipulation, image enhancement, etc., printing, and/or long or short term storage. The peripheral 14 (note that peripheral and peripheral device are used interchangeably herein) may be, for example, a portable electronic device, such as, a gps, mpeg player, etc. The peripheral may be a hard drive, tape drive, input system that may use and/or store data, display system, printer, etc. The phone 15 may be a cell phone, wired phone, cordless phone, satellite phone, picture phone, walkie talkie, or other communication device, etc. The music/video storage/playback device 16 is another example of a device or system with which the memory device 10 may be used and could be either fixed, e.g., as in a home stereo system, or mobile, e.g., as in a car stereo system or mpeg player. In the above examples, the memory device 10 may be used to receive data from one of the systems or devices 11 and/or to transfer data to such system or device.

A common aspect or feature of each of the exemplary systems or devices 11 is that each has a connector receptacle 17. An arrow 18 represents the possibilities of use, connection, insertion in, etc. of the memory device 10 with the respective devices 12-16. The terms connector receptacle or connection receptacle may be used interchangeably and equivalently herein; similarly, the terms connector plug and connection plug may be used interchangeably and equivalently. The connector receptacle 17 of each electronic device or system 11 has the same form factor (size and shape). Moreover, each of the connector receptacles 17 has the same type of electrical connection mechanism in it or those electrical connection mechanisms are similar enough to be able to connect with the memory device 10; and those electrical connection mechanisms may be relatively standard. One example of an electrical connection mechanism is that known as a universal serial bus (USB) electrical connection or connector receptacle, etc. There are several types of USB ports, one of which is referred to as a USB series A connector receptacle. In the current USB specification, for example, the memory device is similar to or has a similar form factor to a USB series A plug.

The memory device 10 has a form factor and electrical connection mechanism or arrangement to mate properly with the connection ports 17 of the several systems/devices 11. The memory device 10 also has control and memory features to interact in a standardized way or uniform way with the respective systems/devices 11 when plugged into a respective connector port 17 to provide data to the system/device and/or to receive data from such system/device.

The size and shape of the memory device 10 is such that it is about the same cross-sectional area along its entire length and that when it is plugged into a connector receptacle 17 it is largely within the connector receptacle. Therefore, it will be appreciated that the memory device 10 is relatively small and compact while being able to carry out the data storage and retrieval functions described below. In other embodiments the size and shape may vary consistent with the relatively small and robust character of the memory device.

The term "largely within" means that the memory device 10 in such an embodiment is entirely within the connector receptacle to which it is connected or at least is sufficiently within the connector receptacle that any part of the memory device that is not within the connector receptacle does not extend so far outside the connector receptacle that the memory device would be prone to be engaged by something that could relatively easily break the memory device or the connector receptacle. One or more portions of the memory device 10 may be exposed outside the connector receptacle 17, e.g., to house part of the memory component or other component in the memory device, to facilitate manual or mechanical grasping of the memory device for placement in or withdrawal from the connector receptacle, etc.

The memory device 10 is an integral unit that not only connects to a connector receptacle 17 but also includes suitable control and memory functions to provide the desired functions of data storage, data transfer or outputting, and/or receiving of data. As is described further below, the form factor, e.g., the physical size and shape, of the memory device 10 is relatively small and the memory device is mechanically and electrically relatively robust inasmuch as it is an integral unit, e.g. one part.

Figure 2A:
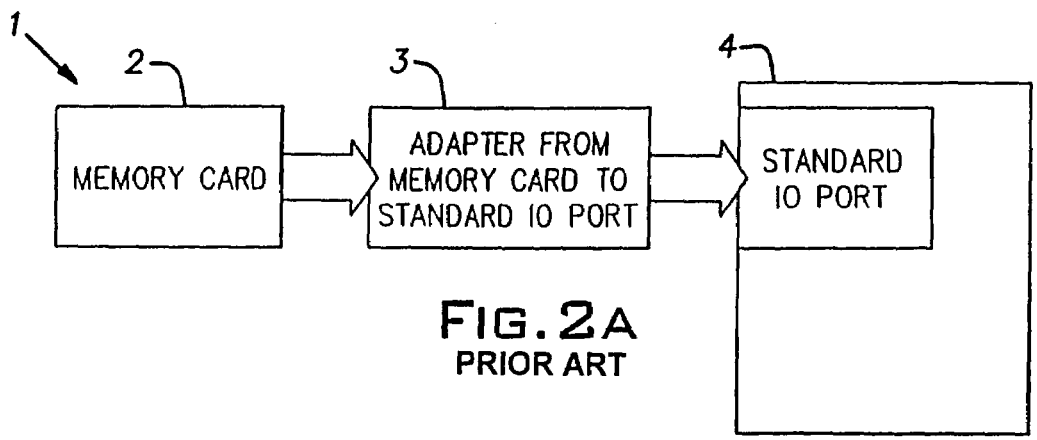
FIG. 2A is a schematic view of a conventional electronic device, such as a digital camera, having a standard IO port, an adapter, and a memory card, the adapter being needed to couple the memory card to the IO port.

Briefly referring to FIG. 2A, a conventional system 1 using a memory card 2, adapter 3 and electronic or electrical device 4 to which the memory card is to be coupled is illustrated. The memory card 2 cannot be used without the adapter; and different types of memory cards and/or electronic or electrical devices may dictate a different adapter.

Figure 2B:
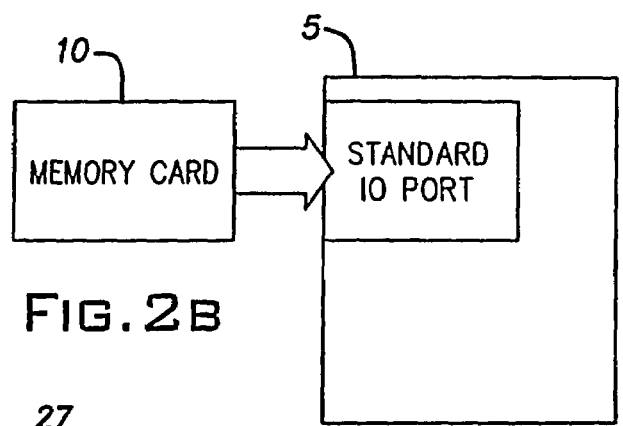
FIG. 2B is a schematic view of the present invention wherein a memory card may be coupled directly to a standard IO port of a device, one example of which is a digital camera, without the need for an adapter.

FIG. 2B illustrates concepts of the present invention, wherein a memory card (e.g. memory device 10) can be connected directly to an electronic or electrical device 5 without the need for an adapter. Moreover, according to an embodiment of the invention, the memory card can fit in or be installed in the device 5 so as to be largely in such device, as is described further below.

Figure 2C:
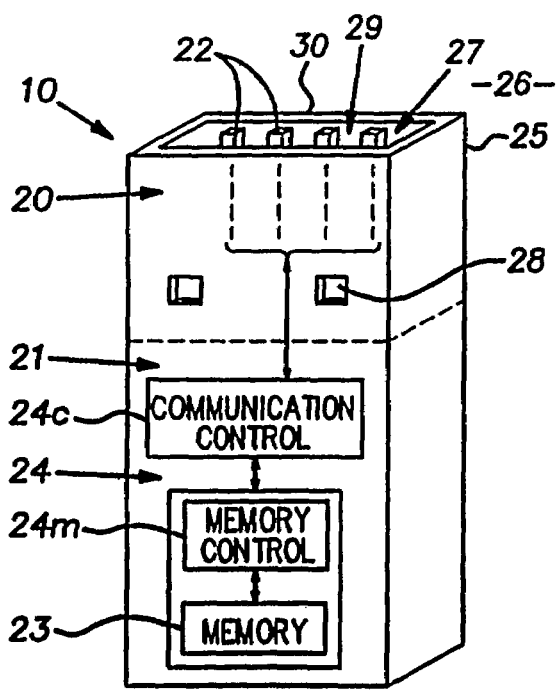
FIG. 2C is a schematic isometric view in vertical orientation of a memory device in accordance with the invention.

Turning, now, to FIG. 2C, a memory device 10 according to an embodiment of the invention has a connector portion 20 and a memory and control portion 21. In the illustrated embodiment the connector portion 20 has a number of electrical terminals 22, sometimes referred to as electrical contacts, for connecting electrically with corresponding electrical terminals in a connector receptacle 17, for example. In an exemplary embodiment the connector portion 20 and electrical terminals 22 have a form factor, shape, configuration, and/or arrangement corresponding to that of a USB series A connector plug that is able to plug into a connector receptacle 17, which is intended to receive and to connect both electrically and mechanically with a USB series A plug.

The memory and control portion 21 of the memory device 10 includes a relatively non-volatile memory, such as, for example, a memory able to receive, to store, and to read out, e.g., to output, data, such as, for example, electronic signals, data representing logic one or logic zero values of a digital or binary data system, etc., as is used conventionally in computer program object code, data stored or used in a conventional computer or another system/device 11, etc. or other data or information. Such a memory is illustrated schematically at 23 in FIG. 2C. The memory 23 may be, for example, a memory cell array, such as that used conventionally in a flash RAM (random access memory), such as those used in memory devices sold under the name of Smart Media card, MultiMedia card, Memory Stick, xD-Picture card, Compact Flash, etc. It will be appreciated that the memory 23 may be another type of memory that currently exists, existed in the past, or may exist in the future.

The memory and control portion 21 also includes a control 24. The control 24 has several functions including controlling storage of data in the data memory 23 and retrieval of data from the data memory 23 and also communication control to control communication between the memory device 10 and the system or device 11 or to respond to control from the system or device 11. Control portion 21 supports, for example, serial and/or parallel communication to provide addressing and data communication. It will be appreciated that the control 24 may include separate portions, such as, for example, a memory control system 24m for directly controlling the data memory 23, for example, and a communication control system 24c that controls communication between the memory device 10, on the one hand, and a system/device 11, on the other hand. In this exemplary embodiment, the communication control system 24c is, for example, a USB controller, which are known, or may be another type of controller. Those two portions of the control 24 may be separate devices, such as, for example, respective integrated circuits, or they may be a common device such as a single integrated circuit that is able to carry out both functions. The memory 23 may be a separate device from the control 24 may be a number of devices, e.g., a number of flash ram devices or the like, that are physically separate from the control 24. Alternatively, if desired the memory 23 and the control 24 may be a single device, e.g., a single integrated circuit having both the desired data storage capability and the control capability described above or such other functions, if needed; or, if unnecessary, the control 24 or part of it may be omitted.

The memory 23 may be a relatively non-volatile memory (electronic or otherwise) that is able to store data without having its own internal power source, although if desired it may have its own internal power source. An example of such memory 23 is a flash memory, which is able to store data and to provide retrieval of data using power supplied by an external device, such as one of the systems/devices 11 connected to the memory via a connector port 17. The memory 23 may be a relatively non-volatile memory that uses a power source to retain data and/or otherwise to function to store and/or to output data. The memory 23 may be a volatile memory, e.g., random access memory (RAM) or it may be non-volatile, e.g. read only memory (ROM), programmable ROM (PROM), selective erasable PROM (EPROM), etc. Suitable exemplary technologies include MOS, Bipolar, ferroelectric, optical, nanotechnology, molecular and the like.

The memory 23 may store many types of data, some examples of which are mentioned elsewhere herein. When the memory 23 is used to store data representing music, movies, videos, voice, games or the like, such as typically may be stored in compact discs (CDs) or digital video discs (DVDs), it may be desirable to provide copy protection, data encryption, etc. features for the memory 23 and/or for the device 10 as a whole to try to avoid wrongful copying and/or use. Various formats for the data stored in the memory may be used; non-limiting examples include word processing formats, those known as xls, mpeg, jpeg, and pdf formats, and so forth. The memory 23 may hold multiple types and formats of data at the same time. Because the present invention is able to couple to a wider variety of electronic devices than previous portable memory designs, in some instances it would be able to store files of various formats simultaneously.

As is seen schematically in FIG. 2C, the memory device 10 includes a housing 25. The housing 25 may be electrically conductive to provide, for example, a discharge path for static electricity or the like, and/or shielding function to block transmission of electromagnetic signals between the area 26 external of the housing and the area or space 27 internal of the housing. The housing 25 may be of metal to provide one or both of those functions, as may be desired. The housing may be of electrically conductive polymer or plastic or of other suitably electrically conductive material to provide the mentioned function(s). The housing may be of an electrically non-conductive material that has an electrically conductive coating, layers or the like to provide the desired function(s).

The housing 25 also provides physical protection for the electrical terminals 22 and for the memory 23 and control 24. Being electrically conductive, the housing 25 also may provide electrical shielding, isolation, grounding and/or connection functions. The electrical terminals 22 and the memory 23 and control 24 may be enclosed substantially entirely within the housing 25 or may be partly enclosed and partly exposed, for example to allow for various electrical connection functions, heat dissipation functions, and the like. Openings 28 in the housing may be provided for retention purposes, e.g., for locating and/or retaining springs or the like to retain the memory device 10 in a conventional USB connector port. Thus, if desired, openings 28 may be provided in the housing at strategic locations to carry out retention and/or other purposes. For example, openings may be provided in the housing 25 to cooperate with an ejection device to eject the memory device 11 from a USB series A connector receptacle or the like. Moreover, an access opening 29 is provided at the front 30 of the housing 25 to allow for electrical connections to be made between the electrical terminals 22 and respective electrical terminals or the like in connector receptacles 17.

Figure 3:
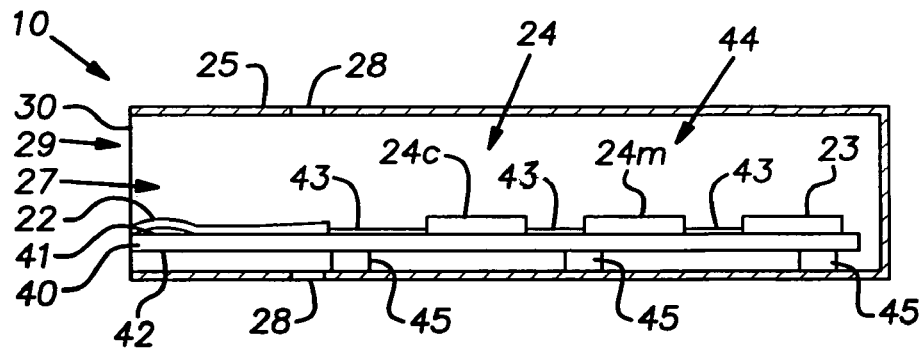
FIG. 3 is a side view, partly broken away in section of the memory of FIG. 2C device showing the portions of the memory device inside the housing thereof.
Figure 4:
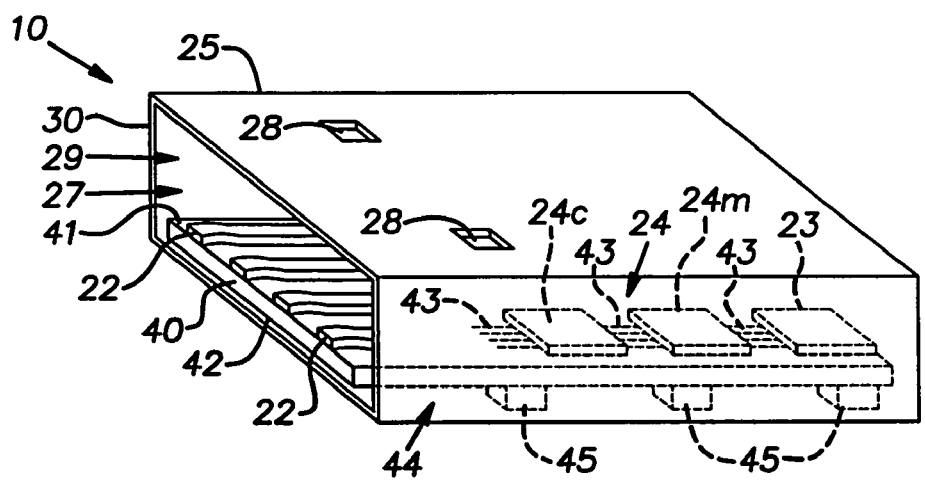
FIG. 4 is a side isometric view of the memory device of FIGS. 2C and 3.
Figure 5:
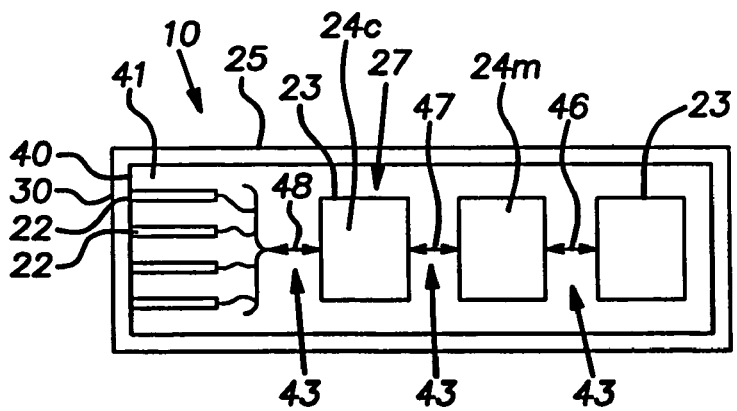
FIG. 5 is a top plan view of a the memory device of FIGS. 2C-4 showing the printed circuit card and other components of the memory device, looking inside its housing, the top of the housing having been effectively removed.
Figure 6:
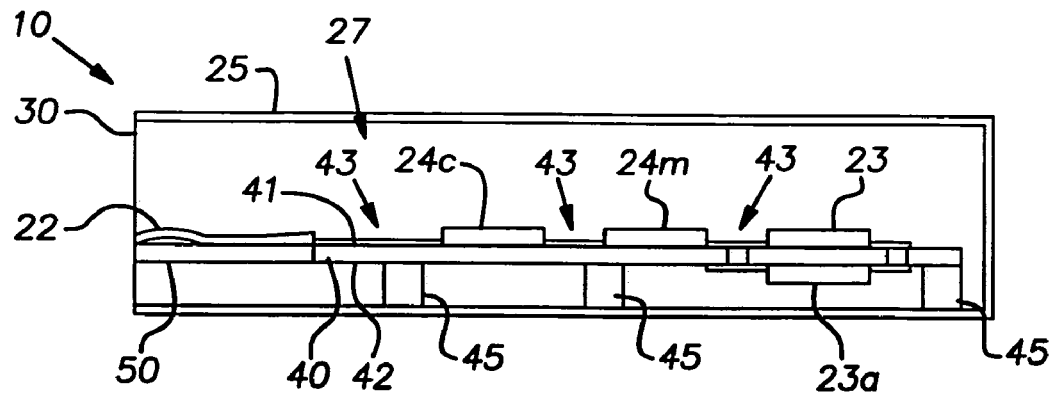
FIG. 6 is a side elevation view, partly broken away, of a memory device having components mounted on both surfaces of the printed circuit board.

Referring to FIGS. 3-5, the several portions of the memory device 10 are illustrated in greater detail. Within the housing 25 is a circuit board 40. The electrical terminals 22 are on or part of the circuit board 40. The electrical terminals are described further below. The memory 23 and control 24 (including both the communication control 24c and memory control 24m) also are on the circuit board. In the embodiment illustrated in FIGS. 3-5 the electrical terminals 22, memory 23 and control 24 are on one surface 41 of the circuit board 40. However, as is illustrated in FIG. 6, for example, one or more of the components that are on the circuit board 40 may be on the other surface 42 thereof.

The control 24 may be a single integrated circuit, chip or device or may be a number of integrated circuits, e.g., as is illustrated at 24c and 24m, that provide functions as a memory controller 24m and input/output controller or USB controller 24c (also referred to herein as communication control). In a number of conventional non-volatile memory devices, such as, for example, Compact Flash type memories or the like, a separate memory controller and I-O (input-output) or USB controller may be provided.

The circuit board 40 has two surfaces 41, 42. Conductive paths 43, e.g., an electrical bus, may be on the surface(s) of the circuit board 40, may be through the board and may be internal of the board, e.g., as in a multilevel circuit board. The conductive paths 43 electrically connect the electrical terminals 22, data memory 23 and control system 24 for usual operation of receiving, storing, and outputting or reading out data, for example. The electrical terminals 22, data memory 23, control system 24 and conductive paths 43 are on the circuit board 40 and form a sub-assembly 44. The sub-assembly 44 is located in the interior space 27 of the housing 25. The housing 25 and the sub-assembly 44 are secured together by suitable securement mechanism, such as, for example, adhesive, solder connection, mechanical retainer, e.g., a stud, rivet, or any other suitable mechanism to form an integral structure to retain the sub-assembly 44 with respect to the housing 25. As an example of such securement, stand-offs 45, e.g., plastic studs, electrically non-conductive rivets, screws, bolds, studs, or electrically conductive ones, etc., support and retain the circuit board 40 in the housing 25, as is illustrated in FIGS. 3 and 4. If desired, captivating indentations in the housing may be used to position and to secure or to retain the sub-assembly 44 in the housing. For example, captivating indentations may be formed by pushing or pressing on the outside of the housing 25 to cause it to deform to crate guides or detents on the inside of the housing; and those guides or detents may be used to position and to retain the sub-assembly 44 therein, e.g., by mechanical interference, by friction fit and/or by press fit.

In an embodiment of the memory device 10 the memory 23 and control 24 are mechanically and electrically connected to the circuit board 40. For example, the circuit board 40 may have a number of electrically conductive traces thereon and/or therein, and the memory 23 and control 24 may be attached at respective electrically conductive parts thereof, e.g., terminals or the like, to such electrically conductive traces, terminal pads or the like, using wire bonding techniques, or other techniques. Wiring bonding techniques tend to minimize the amount of space required to make electrical and mechanical connection of an integrated circuit, for example, to a circuit board, thus providing the electrical and mechanical attachment of an integrated circuit or the like to a circuit board and to respective electrically conductive portions of such a circuit board. Electrically conductive adhesive, solder and/or other techniques also may be used for such mechanical and/or electrical connecting of the memory 23, control 24 and/or other parts to the circuit board 40.

As is seen in FIG. 5, the control 24 includes two portions, a memory controller 24m and a USB controller 24c. The memory controller and USB controller may be separate integrated circuit devices, a common integrated circuit device, or an integrated circuit device that provides the suitable functions to store and/or to retrieve data with respect to the memory 23, on the one hand, as would be the case for the memory controller 24m, and to provide input/output control functions of a USB controller 24c. Such functions of a USB controller may be, for example, to effect conversion of parallel format data from the memory 23 to serial format data for delivery to the system/device 11, e.g., packetizing such data, receiving packetized data and converting it to parallel data for storage in the memory, and/or providing control functions and communication functions with a system/device 11 to send and/or to receive data with respect there to. Moreover, fewer control functions may be provided by the control system 24, as may be desired, and/or multiple control functions may be provided and selectively called upon from the particular system/device 11 with which the memory device 10 may be used.

An example of electrically conductive paths 43 of the circuit board 40 are illustrated at 46, 47 and 48. Such conductive paths 43 may be referred to as an electrical bus. At 46 and 47 a number of electrically conductive paths are represented by a single doubled sided arrow allowing for electrical connection between the memory 23 and the control 24, on the one hand, and between respective parts of the control 24, on the other hand. The electrical connections 48 are provided between the respective electrical terminals 22 and the control system 24.

As is illustrated in the drawings, the interior space 27 of the housing 25 of the memory device 10 is adequate in height to provide space for the electrical terminals 22 and for the insertion of corresponding electrical terminals and associated portions of a USB series "A" connector receptacle. The interior space 27 also is adequate to contain or to house the data memory 23 and control system 24 without any change or without a significant change in height dimension H or width dimension W of the housing 25 from that of a conventional USB series "A" connector plug. Thus, the form factor for the memory device 10 is the same or substantially the same as that of a conventional USB series "A" connector plug in the height and width dimensions. However, the length dimension L of the memory device 10 may be greater than that of a conventional USB connector thereby to provide adequate space for the data memory 23 and controller 24 within the housing while still being small enough to be largely within the device to which the memory device is connected or is to be connected.

Reference is made to FIG. 6. In a conventional USB connector the electrical terminals 22 are mounted on a thermoplastic insulator. However, in the present invention the conventional insulator may be replaced by the circuit board 40 so that the electrical terminals 22 are on the circuit board as are the data memory 23 and control system 24. The electrical terminals 22 may be plated on the circuit board 40 and be on it in that sense, or the terminals may be otherwise on the circuit board, as is described further below, for example. If desired, for consistency with the USB standard, the front portion of the circuit board 40 where the electrical terminals are located may include a leading portion of electrically insulating thermoplastic material, as is represented, for example, in FIG. 6 at 50.

Furthermore, as is illustrated in FIG. 6, one or more parts of the data memory 23 and/or control system 24 may be on respective surfaces 41, 42 of the circuit board 40. As an example, in FIG. 6 two separate parts of the memory 23, 23a are on respective surfaces 41, 42 of the circuit board 40. Those memory portions 23, 23a may be connected by the conductive paths 43 and/or by plated through holes, etc. of the circuit board 40.

Figure 7:
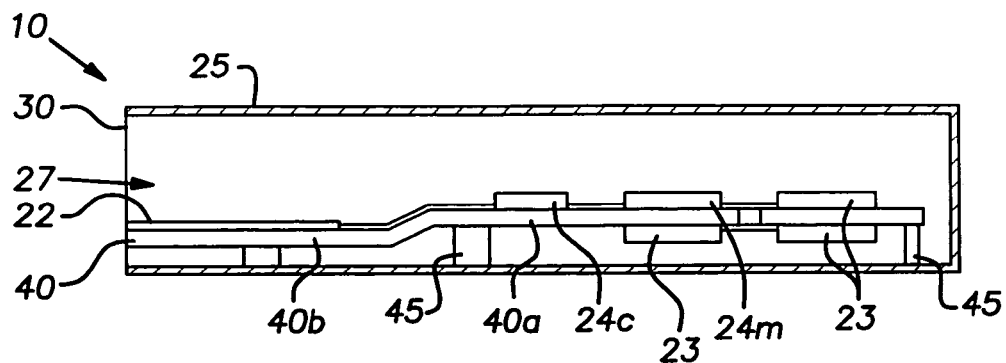
FIG. 7 is a side elevation view, partly broken away in section of a memory device with a circuit board and components on both sides of a stepped or angled circuit board.
Figure 8:
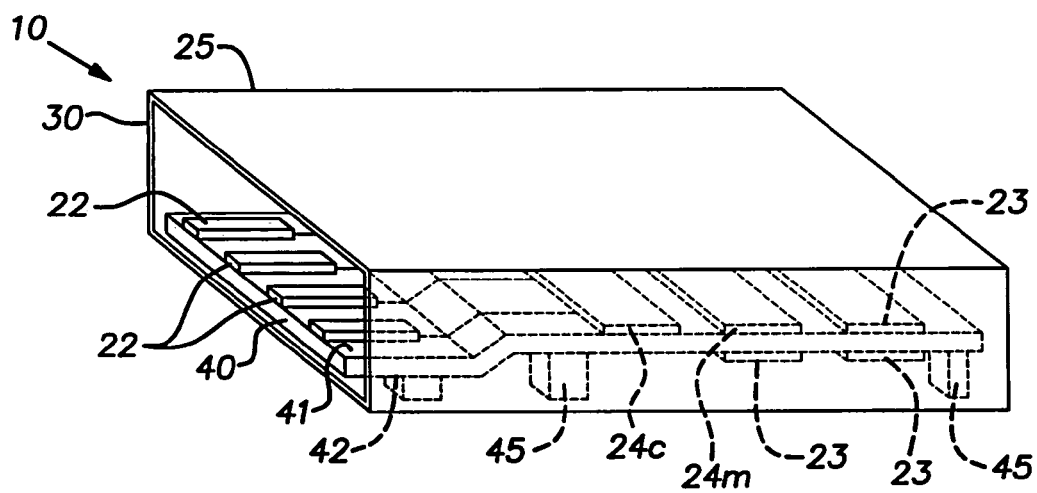
FIG. 8 is a side isometric view of the memory device of FIG. 7.
Figure 9:
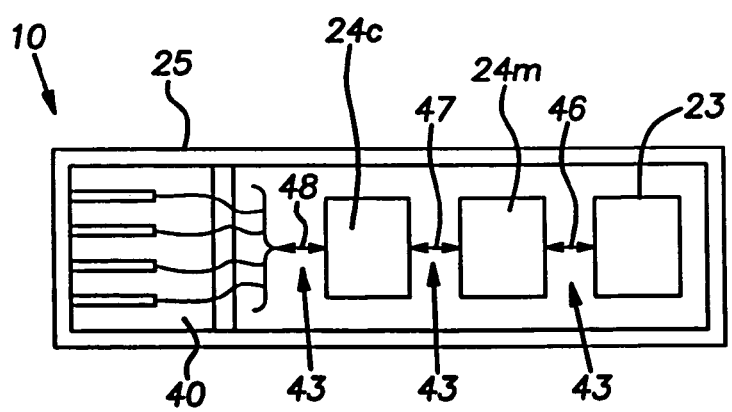
FIG. 9 is a top plan view of a the memory device of FIGS. 7 and 8 showing the printed circuit card and other components of the memory device, looking inside its housing, the top of the housing having been effectively removed.

Also, as is illustrated in FIGS. 7-9, the circuit board 40 may include a step portion 52 or a discontinuous portion or a portion separate from another portion of the circuit board 40 such that the electrical terminals 22 or some other part of the subassembly 44 is separated height-wise in the housing 25 from the other portion of the circuit board 40 or subassembly 44. The step 52 allows the back portion 40a of the circuit board to be more centrally located in the housing 25 to provide adequate space for components to be mounted on both surfaces of the circuit board, whereby the front portion 40b of the circuit board (and/or the thermoplastic insulator mentioned above) and terminals 22 are appropriately positioned to connect with another USB connector.

Figure 10:
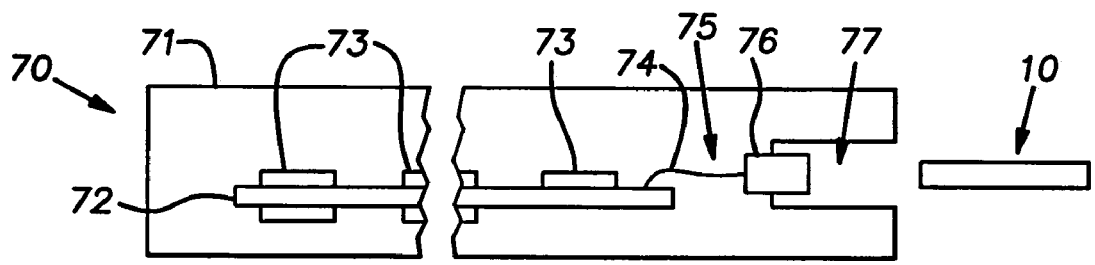
FIG. 10 is a schematic side view, partly broken away, of a device, such as a computer, camera, etc., having a recess and a connector port for a memory device.
Figure 11:
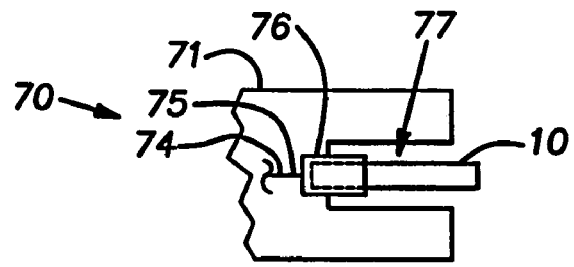
FIG. 11 is a fragmentary isometric view of the device of FIG. 10 with a memory device installed therein.
Figure 12:
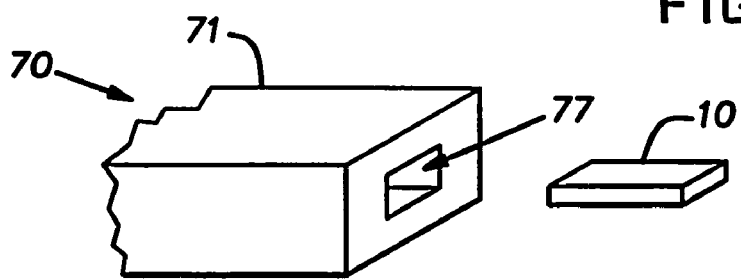
FIG. 12 is a fragmentary isometric view of the device of FIGS. 10 and 11 with a memory device aligned with a recess and connector port thereof.

Briefly referring to FIGS. 10-12, which appear on the same drawing sheet as FIG. 6, a device 70, such as a computer, camera, or other electrical or electronic device or device, e.g., as is shown at 11 in FIG. 1, that has a USB connector receptacle, or the like, e.g., as is shown at 17 in FIG. 1, is illustrated with a memory device 10 aligned for connection thereto. In the example of FIGS. 10-12, the device 70 is a computer having a case 71 and one or more printed circuit boards 72 or the like therein with circuit components, e.g., integrated circuits 73 on the circuit board and/or otherwise coupled thereto and/or to each other by electrical connections, busses, etc., not shown. Other components, e.g., other printed circuit cards, disk drives, power supply, etc., may be included in the computer 70. A connection 74, e.g., electrical conductors, a cable, etc., connects portions of the computer 70 to a USB port 75, which includes a USB Series "A" connector receptacle 76. The connector receptacle 76 is positioned in a recess, slot, opening, or the like designated 77 into which the memory device 10 may be inserted. Such insertion is illustrated in FIG. 11 whereby part or all of the memory device is in the slot so that the memory device is not exposed outside the case 71 or only a relatively small portion of the memory device 10 is outside the case. An ejector, not shown, (conventional ejectors are known) may be used to eject the memory device from the connector port 76 and slot 77. To facilitate cooperation with an ejector, appropriate opening, notches or the like may be provided in the memory device, e.g., in the housing 25 thereof, for cooperation with ejecting levers, springs, or the like. Such an ejector may be of the type conventionally used to eject a Compact Flash card from a digital camera socket or some other ejector.

Figure 13:
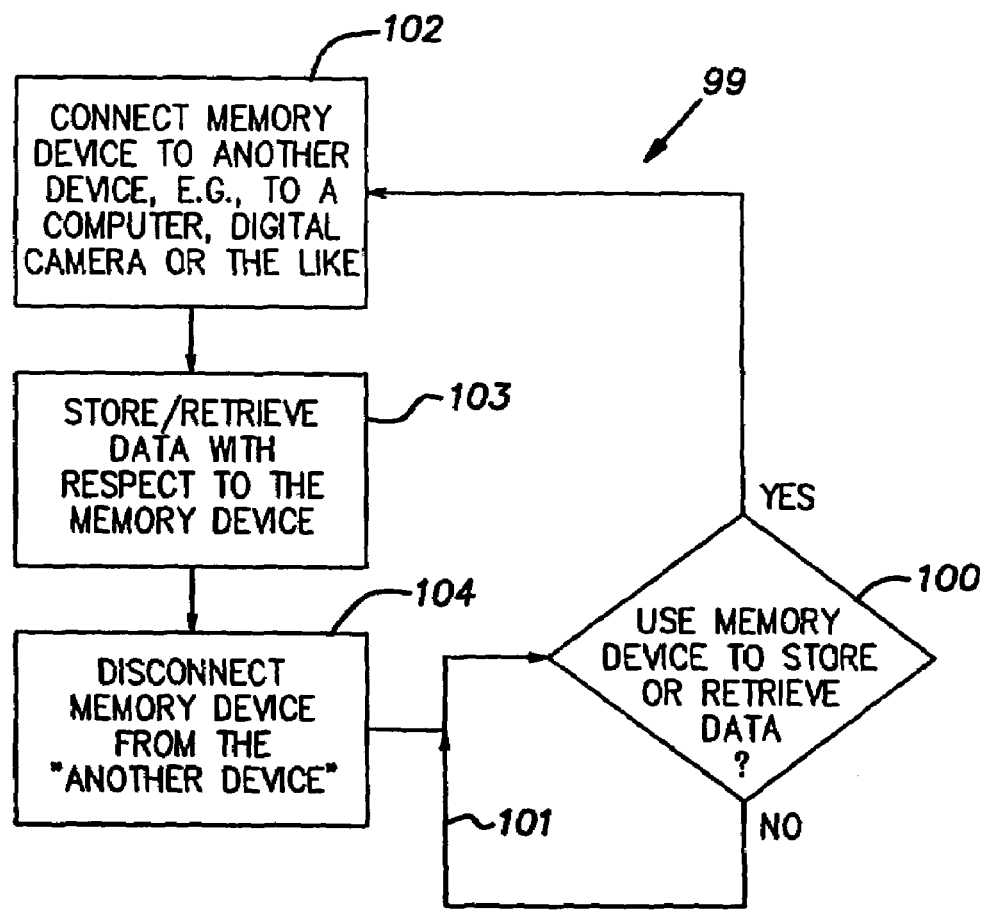
FIG. 13 is a flow chart illustrating a method of the invention.

Briefly turning to FIG. 13, a method 99 of using the invention is illustrated. At block 100 an inquiry is made whether a memory device is to be used to store data or from which to retrieve data. If no, then a loop 101 is followed. If yes, then at block 102 the memory device is connected to another device, e.g., to computer 70 or some other device (FIGS. 1 and 10-12). At block 103 data is stored in and/or is retrieved from the memory device 10. At block 104, when it is desired to remove the memory device 10 from the other device 70, e.g., a computer, camera or the like, it is removed physically therefrom and can continue to store data in the memory device 10 for subsequent use.

Although the invention is described with respect to a small memory device 10 that has a USB type of form factor and can be installed in a computer, camera, etc., without sticking out or without sticking out very much, nevertheless, the principles of the invention may be used with connectors other than USB type.

Referring to FIGS. 14-21, the subassembly 44 is illustrated. The subassembly 44 includes a circuit board and contacts arrangement 500 that fits in or is located in the housing of the memory device 10 shown, for example, in FIG. 2C. As is seen in FIG. 14 in top view the circuit board and contacts arrangement 500 includes a circuit board 501, e.g., a conventional printed circuit board, and a leading or forward portion 502, such as, for example, a thermoplastic material of the type typically used in USB Series A connectors. The forward portion may be some other material, as desired, as may be the circuit board.

The circuit board 501 and forward portion 502 may be the same part, e.g. and integral structure that extends the entire length L of the circuit board and contacts arrangement 500, as is illustrated in FIG. 14, for example. In the following discussion, the circuit board 501 and forward portion 502 will be described as a single integral part or circuit board 503 that is made of conventional circuit board material or other suitable material.

Referring to the top view of the circuit board 503 as it is illustrated in FIG. 14, on the top surface 504 is an integrated circuit chip or die 505, which may be, for example, a controller circuit of the type described above or may be a memory circuit also of the type described above. Other components generally indicated at 506 are on the top surface of 504 of the circuit board 503. Examples of those components may be capacitors, resistors, inductors, transistors, amplifiers, etc. A crystal 507, e.g., a crystal oscillator, is on the circuit board to provide usual frequency functions, synchronizing functions, etc. Also, a switch 508 may be on the circuit board to be operated by electrical input and/or by a mechanical input switch portion 509 thereto to carry out one or more functions. One example of a function for the switch 508 is to set up the circuitry such as the memory circuitry, for example, of the subassembly 44 so as to be read only, read, erase and write, etc.

Electrical contacts 22 are seen in FIG. 14 at the forward portion 502 of the circuit board 503. An annular spacer 515 is at the forward portion of the circuit board 503. The annular rim in 515 will be described in greater detail below as will be the contacts.

Briefly referring to FIG. 15, a bottom view of the circuit board 503 is illustrated. On the bottom surface 516 are two memory circuits, memory chips, memory dies, etc. 517, 518. Additional components 506 also are on the bottom of the circuit board 503. The various controller 505, memory circuits 517, 518, and components 506, 507 and switch 508 may be attached to, mounted on, coupled to, etc., the circuit board using conventional mechanical and electrical fastening techniques. Examples of such techniques include wire bonding, conductive adhesive, soldering, various surface mount techniques, and/or other techniques currently available or developed in the future. The various devices, e.g., the controller 505, components 506, 507, 508, memory circuits 517, 518, etc., may be referred to collectively as components.

In the exemplary embodiment illustrated in FIGS. 14 and 15 a single controller 505 is on the top surface of the circuit board and two memory circuits are on the bottom surface of the circuit board. However, it will be appreciated that other arrangements may be provided for those controller and memory circuits. Moreover, as was mentioned above, there may be more or fewer of such circuits. It may be possible that controller functions and memory functions are in the same circuit, which may be larger or smaller than those that are illustrated in FIGS. 14 and 15. If desired, the length L of the circuit board 503 may be larger or smaller than that illustrated in FIGS. 14 and 15. A smaller circuit board may provide space for only a single integrated circuit on the top surface and a single integrated circuit on the bottom surface, e.g., a controller and a memory circuit, respectively. However, if desired, the length could be enlarged to provide more space for accommodating more memory and/or controller circuits and/or components that may be needed or desired in the memory device 10.

The circuit board 503 may include one or more electrically conductive traces or paths, several of which are indicated generally at 520. Such electrically conductive paths may be on a single surface, on both surfaces, and/or within e.g., a multi-layer format, the circuit board 503. The several electrically conductive paths are illustrated schematically. It will be appreciated that the number and arrangement of those electrically conductive paths may be so designed as to carry out the desired functions, electrical connections, mechanical connections, etc. of the various parts of the subassembly 44 and memory device 10. Additionally, plated through openings, for example, as are illustrated schematically at 521, may be provided to effect electrical interconnections between electrically conductive paths, circuits, components, etc. on the respective surfaces 504, 516 of the circuit board 503.

In the bottom view of FIG. 15 spacer legs 530, 531 at the sides of the circuit board 503 and spacer 532 at the front of the circuit board 503 are illustrated. The spacer legs 530, 531 provide spacing function to space the circuit board 503 in the housing 25 of the memory device 10. A spacer bar 533 across a top portion of the circuit board 503 also provides a spacing function to space the circuit board 503 properly in the housing 25. The spacer legs 530-532 and the spacer bar 533 are part of the annular rim 515. The annular 515, including the spacer legs and bar may be formed on the circuit board 503 by plastic molding directly thereto or by some other technique.

Turning to FIG. 16 a side view of the circuit board 503 is illustrated. The extent to which the spacer legs and bar 530-532 extend below the surface 516 of the circuit board 503 and the extent to which the spacer bar or strap 533 extends above the surface 504 of the circuit board can be seen in FIG. 16. Such spacing provides for adequate clearance between the integrated circuits, dies, 517, 518 and the components 506 and switch 508, etc. in the housing 25. As is seen in FIG. 15 (the bottom view of the subassembly 44, there is adequate space between the spacer legs 530, 531 in the illustrated embodiment to provide for positioning of an integrated circuit, e.g., a memory circuit, 518 between those legs. Thus, it will be appreciated that the spacers 530-533 position the subassembly 44 in the housing 25 with the various electrical and electronic components on the circuit board 503 and with the contacts 22 on the circuit board, too, as is described in further detail below. The spacers 530-533 may engage the interior wall of the housing suitably, e.g., with adequate friction force thereagainst, by elastic or resilient pressure against the interior wall of the housing, by the formation of the wall into engagement with such spacers, etc. to provide a reasonably stable and positionally secure locating of the subassembly 44 with respect to the housing 25. The spacer bar 532 at the forward end of the circuit board 503 provides a measure of protection for the components mounted at the bottom surface 516 of the circuit board 503 to block insertion of unintended objects into engagement with those components from the front of the memory device or front of the housing, etc. Additionally, the spacer bar or strap 533 provides similar protective function for the components mounted on the top surface 504 of the circuit board 503.

While FIG. 16 is a side view of the subassembly 44, FIG. 17 is a side cross section view of the subassembly 44. The spacer leg 531 is omitted from the illustration of FIG. 17 to avoid confusion in the drawing. Such spacer leg 531, though, would be in background behind the component 518, for example. It will be appreciated that in the illustrations of the various drawing figures hereof, the parts generally are shown schematically without regard to accuracy of dimensions. The actual dimensions of the parts may vary to meet this appropriate requirements, such as, for example, a USB specification, or some other specification. Furthermore, various parts are shown schematically, such as, for example, the components 505-508, 517 and 518. The actual size, shape, arrangement, etc. of those components, positioning thereof in the subassembly 44, etc., may be varied, depending on size and space requirements, various specifications, such as the USB specification, etc. Moreover, a number of the components 506 are not illustrated to avoid confusion in the drawing and to allow for simplification of the various drawing figures.

It will be appreciated that the arrangement of components, e.g., the components 505-508, 517, and 518 in the manner illustrated and described herein on both surfaces of the printed circuit board 503 makes efficient use of the circuit board "real estate" both above and below the circuit board within the connector so that the memory device 10 can be quite small and yet be a rather powerful device for the purposes described herein and for other purposes whether already existing or coming into existence in the future.

In FIGS. 18 and 19 an embodiment of the invention including an arrangement of electrical contacts 22 (also referred to as terminals) on the circuit board 503 is illustrated. The terminals 22 are elongate, as is illustrated in FIG. 19, and the terminals have a curved or arcuate cross-section generally about an axis 540. The terminals 22 are of a suitable metal material, such as, for example, that which is specified in the USB specification.

As is seen in FIG. 18 a number of elongate grooves 541 are formed in the top or top surface 504 of the circuit board 503. The elongate grooves 541 may be formed by routing, milling, or by some other technique. The grooves 541 may be formed as part of a molding process by which the circuit board may be made. The grooves 541 extend in a direction of the length L (FIG. 14) of the circuit board. The width W and depth D of the grooves 541 may be such that a terminal 22 fits in the groove so as to be in somewhat spring-loaded against the side walls 542 of the grooves. Thus, the terminal 22 may be slightly resiliently deformed or compressed about the axis 540 to place the terminal in a given groove and then the terminal can be released so that the edges 543 tend to engage the walls 542 providing either a friction grip, a biting grip slightly cutting into the wall, etc. The terminals 22 are of a size and shape to cooperate with the width and depth dimensions W, D of the grooves 541 so that a tap portion 544 of each terminal tends to protrude at least slightly above the top surface 504 of the circuit board 503 to be available conveniently to engage with another terminal of a USB series A receptacle, for example.

Briefly turning to FIG. 20, the top 504 of the circuit board 503 is illustrated. The grooves 541 also are illustrated. As is shown in FIG. 20 the two grooves 541a, 541b near the outer perimeter or outer edge of the circuit board 503 extend closer to the front 550 of the circuit board than the two grooves 541c, 541d. The terminals 22 in the grooves 541a, 541b may be respectively ground and power terminals, and the terminals 541c and 541d may be respectively signal terminals.

A bottom view of the circuit board 503 is illustrated in FIG. 21. In FIG. 21 the bottom 516 of the circuit board 503 is seen. A cutout 552 also is shown around the forward edges of the circuit board.

The annular rim 515 (FIG. 14), including the spacers 530-532 at the bottom of the circuit board 503 and along part of the sides and front of the circuit board, and the spacer bar 533 at the top 504 of the circuit board may be formed by plastic injection molding, insert molding, or the like. The terminals 22 may be installed in the grooves 541 of the circuit board 503 prior to such insert molding or the terminals may be installed after such insert molding. If installed prior to such molding, then the molded material may be used to help retain the terminals properly in position on the circuit board.

The annular rim 515 extends slightly above the top surface 504 of the printed circuit board 503 to provide a further spacing function.

As was mentioned above, different types of terminals may be used in the subassembly 44 for the memory device 10. Another example of terminals is terminals that are plated or directly applied to the circuit board 503. The USB specification provides identification for such plated terminals formed of palladium plating and a top surface of gold thereon. Thus, using such plated terminals, the terminals may be plated directly to the top surface 504 of the circuit board 503 without the need to form grooves 541.

Briefly referring to FIGS. 22-24, use of a memory device 10 in respective devices is illustrated schematically. In FIG. 22 a memory device 10 is installed in a camera 600. The camera 600 has a USB series A connector receptacle 601 and the memory device 10 is largely within the camera, e.g., in this illustration the memory device 10 is of the size of a USB series A connector plug and it fits entirely within the USB series A connector receptacle. A push button ejector 602 is illustrated on the back of the camera 600; the button may be pressed to eject the memory device. The memory device may be used, for example, to store data representing digital images.

In FIG. 23 a memory device 10 is largely within a cellular telephone 610. The cellular telephone has a USB series A connector receptacle 611, and the memory device has a form factor similar to that of a USB series A connector plug. The memory device 10 is largely within the connector receptacle 611, although a small part of the memory device sticks out (e.g., is exposed) from the cellular telephone and connector receptacle 611. The part of the memory device 10 that is exposed may be grasped to withdraw the memory device from the connector receptacle. The memory device may be used, for example, to store telephone numbers, telephone messages, etc. The telephone may have an eyelet 612 to which a strap may be attached to carry the telephone.

In FIG. 24 a laptop computer 620 is illustrated. The laptop computer has a USB series A connector receptacle 621, and a memory device 10 is plugged into that connector receptacle so as to be largely within the connector receptacle and, thus, within the laptop computer.

FIGS. 25 and 26 illustrate a removal strap or handle 700 for use with a memory device 10. The removal strap 700 includes a pair of slide arms 701, 702 and a cross arm 703. The slide arms 701, 702 have portions that extend through openings 704, 705 in the back wall or back end 706 of the housing 25 of the memory device 10. A storage area 710 in the housing 25 is provided for the slide arms 701, 702 when the removal strap 700 is in stored position, as is represented by the dotted portion 702a in FIG. 25 and is represented in solid lines in FIG. 26. Stops 711, 712 at the ends of the respective slide arms 701, 702 cooperate with the back wall 706 to prevent the removal strap 700 from pulling entirely out of the housing 25. A detent 713, such as a recess or opening, in one (or both) of the slide arms cooperates with a corresponding detent 714, e.g., a deformed metal part, protrusion, etc., in the side wall 715 of the housing 25 to tend to retain the removal strap in its stored position unless the removal strap is intentionally withdrawn to the position shown in FIG. 25. In FIGS. 25 and 26 the circuit board 503, components 506, memory circuit 517, and surface mount recesses 716 also are illustrated, the latter to facilitate mounting components, memory circuit and the like to the circuit board, for example.

Ordinarily the removal strap 700 may be stored in the housing 25 of the device as is illustrated in FIG. 26 and in the dotted outline for the slide arm 701 in FIG. 25. However, by grasping the cross arm 703, e.g., between a thumb and forefinger or in some other way, the removal strap can be pulled part way out of the housing 25 to the condition shown in solid lines in FIG. 25 and used to pull the memory device out from a USB series A connector receptacle or from some other device to which the memory device 10 is attached.

The invention claimed is:

1. A memory device for interconnection with a Universal Serial Bus (USB) Series A type receptacle of an electronic device, comprising:
   a housing wherein the housing is largely rectangular, with the width and height of a USB Series A plug standard housing;
   a connector within the housing;
   electrical terminals in the housing;
   the housing and terminals of a form to connect with the USB Series A receptacle of the electronic device; and
   a data memory and a controller within the housing; and
   wherein a plurality of components, including the controller and the data memory, is attached to a circuit board, and the circuit board contains a step to locate at least part of the circuit board centrally within the housing to provide space above and below the circuit board, and at least one component is attached to each side of the circuit board.

2. The memory device according to claim 1, wherein the housing is largely conductive.

3. The memory device according to claim 1, wherein the housing is electrically conductive.

4. The memory device according to claim 1, wherein additional minor electronic components to provide respective functionality of the memory device are within the housing.

5. The memory device according to claim 4, wherein said additional minor electronic components comprise at least one of resistor, capacitor and crystal.

6. The memory device of claim 1, wherein the connector is an integral one piece unit.

7. The memory device according to claim 1, wherein the controller controls the data input and output between the memory device and the electronic device and manages storing and retrieving data with respect to memory addresses in the memory device.

8. The memory device according to claim 7, wherein the controller and memory are separate integrated circuits.

9. The memory device according to claim 7, wherein the controller and memory are combined into one integrated circuit.

10. The memory device according to claim 1, wherein the controller includes at least two sub-controllers, one of the sub-controllers controls the data input and output between the memory device and the electronic device and another sub-controller manages storing and retrieving data with respect to memory locations in the memory device.

11. The memory device according to claim 1, wherein all of the circuit board is in the housing.

12. The memory device according to claim 1, wherein all of the components are in the housing.

13. The memory device according to claim 1, wherein there exists a wire-bonded connection between the circuit board and at least one of the group comprising the memory, the controller, and the electrical terminals.

14. The memory device according to claim 1, wherein there exists soldered connections between the circuit board and at least one of the group comprising the memory, the controller, and the electrical terminals.

15. The memory device according to claim 1, wherein the terminals are attached directly to the circuit board.

16. The memory device according to claim 15, wherein the USB electrical terminals are printed on the circuit board.

17. The memory device according to claim 15, wherein the terminals are plated to the circuit board.

18. The memory device according to claim 17, wherein the terminals are gold on palladium.

19. The memory device according to claim 17, wherein the terminals are electrically connected to conductive paths of the circuit board.

20. The memory device according to claim 17, wherein the length of the housing is small enough to be completely inserted into small transportable devices.

21. The memory device according to claim 20, wherein the length of the housing is approximately 1.3 inches.

22. The memory device according to claim 20, wherein the length of the housing is approximately 1.0 inches.

23. The memory device according to claim 15, wherein the circuit board has a number of grooves and a respective terminal is positioned in respective grooves.

24. The memory device according to claim 23, wherein the grooves are elongated in an axial direction and the terminals are bowed in a convex curvature generally partially about such axial direction.

25. The memory device according to claim 24, wherein the terminals are connected to conductive paths of the circuit board.

26. The memory device according to claim 1, wherein the data memory comprises a flash memory.

27. The memory device according to claim 1, wherein the data memory comprises a non-volatile memory.

28. A memory device, comprising
   a circuit board;
   an I/O controller;
   a data memory;
   a memory controller; and an electrical connector having terminals for electrical connection to another device, wherein the terminals of the electrical connector are on the circuit board, and wherein the electrical connector includes a housing having a form factor to plug directly into a connector port of the other device, and the circuit board contains a step to locate at least part of the circuit board centrally within the housing to provide space above and below the circuit board, and at least one component comprising the group of the controller, data memory, memory controller and terminals is attached to each side of the circuit board.

29. The memory device according to claim 28, wherein the housing is conductive.

30. The memory device according to claim 28, wherein all of the circuit board is in the housing.

31. The memory device according to claim 28, wherein all of the circuit board, controller, data memory, memory controller and connector terminals are in the housing.

32. The memory device according to claim 28, wherein the electrical connector is a standard USB Series A plug connector.

33. The memory device according to claim 28, wherein the electrical connector is a standard firewire connector.

34. The memory device according to claim 28, wherein the electrical connector is a standard serial connector.

35. The memory device according to claim 28, wherein the data memory is a flash memory.

36. A memory device able to connect directly to a peripheral and connect directly to a computer, comprising:
a data memory;
a controller; and
an electrical connector having terminals to connect to another device,
wherein the electrical connector includes a housing having a form factor to plug directly into a connector port of the computer; and
wherein a plurality of components of the group comprising the data memory, the controller, and the connector terminals is attached to a circuit board, and the circuit board contains a step to locate at least part of the circuit board centrally within the housing to provide space above and below the circuit board, and at least one component is attached to each side of the circuit board.

37. The memory device according to claim 36, wherein the electrical connector housing is conductive.

38. The memory device according to claim 36, wherein the connector terminals are printed on the circuit board.

39. The memory device according to claim 36, wherein the connector terminals are attached directly to the circuit board.

40. The memory device according to claim 36, wherein a wire bond connection is provided between conductive paths of the circuit board and at least one of the data memory and controller.

41. The memory device according to claim 36, wherein the electrical connector is a standard USB connector.

42. The memory device according to claim 36, wherein the electrical connector comprises a standard firewire connector.

43. The memory device according to claim 36, wherein the electrical connector comprises a serial connector.

44. The memory device according to claim 36, wherein the data memory comprises a flash memory.

45. A storage apparatus, comprising:
a memory unit for preserving data received from an electronic device;
a connector for connecting the apparatus to an electronic device;
a communication control system between the connector and the memory unit for arranging data received from a connected electronic device through the connector and the memory unit to the desired format for transmission to the memory unit and a connected electronic device, respectively; and
a casing retaining the memory unit, the communication control system, and the connector as an integral unit, the casing having a form factor in at least two directions comparable to the form factor in the same two directions of a standard electrical connector casing; and
wherein the integral unit is attached to a circuit board, and the circuit board contains a step to locate at least part of the circuit board centrally within the casing to provide space above and below the circuit board, and at least one component of the integral unit is attached to each side of the circuit board.

46. The storage apparatus according to claim 45, wherein said connector is a medium for data sent between the apparatus and the electronic device.

47. The storage apparatus according to claim 46, where the casing is box shape, and the height and width of the of the protruding connector are approximately the same size as the height and width of the casing.

48. The storage apparatus according to claim 46, where the height and width of the protruding connector are approximately the same size as the height and width of the casing.

49. The storage apparatus according to claim 45, wherein the connector comprises a Universal Serial Bus Type A (USB-A) connector.

50. The storage apparatus according to claim 45, where the apparatus is powered by the connected electronic device.

51. The storage apparatus according to claim 45, wherein each memory unit comprises:
a memory cell array for storing data received from the connected electronic device through the communication control system for later retrieval; and
a memory control system for processing and implementing instructions requesting a specific action on the memory cell array received from the connected electronic device through the communication control system and for accessing designated areas of the memory cell array to write data to or read data from the memory cells in the areas.

52. The storage apparatus according to claim 45, wherein the memory unit uses an optical recording technique.

53. The storage apparatus according to claim 45, wherein the memory unit is a solid state device.

54. The storage apparatus according to claim 45, wherein the memory unit uses a magnetic recording technique.

55. A storage apparatus, comprising:
a connector for connecting the apparatus to an electronic device and for being a medium for data sent between the apparatus and the electronic device; and
at least one memory unit for preserving data received from the connected electronic device and for later retrieval of the data by the electronic device or another electronic device; and
a communication control system between the connector and the memory unit for arranging data received from the connected electronic device through the connector and the memory unit to the desired format for transmission to the memory unit and the connected electronic device respectively; and wherein the connector includes a housing containing at least part of the memory unit and at least part of the communication control system, and wherein the storage apparatus is small enough to fit fully or nearly fully within at least one of the electronic devices, and wherein the dimensions of the storage apparatus housing are the same in at least two dimensions as a standard connector; and wherein a plurality of components of the group comprising the memory unit or communications control system is attached to a circuit board, and the circuit board contains a step to locate at least part of the circuit board centrally within the housing to provide space above and below the circuit board, and at least one component is attached to each side of the circuit board.

56. An electronic memory device, comprising
a non-volatile memory, and
a housing having electrical conductivity for at least one of grounding, guarding and static discharge,
the memory being at least partly in the housing,
a memory controller at least partly in the housing;
the housing having a form factor to plug directly into a connector port of an electronic device, and
the housing fitting either completely or nearly completely into some electronic devices; and
wherein the memory and memory controller are attached to a circuit board, and the circuit board contains a step to locate at least part of the circuit board centrally within the housing to provide space above and below the circuit board, and at least one of the memory or memory controller is attached to each side of the circuit board.

57. The device of claim 56, said housing having a form factor of a USB type electrical connector, and the memory being substantially entirely in the housing.

58. The device of claim 56, said circuit board being substantially entirely in the housing.

59. The device of claim 58, further comprising electrical terminals, at least one of which is attached directly to or placed on the circuit board.

60. A portable computing device or peripheral comprising a housing, a receptacle in the housing, the receptacle having a form factor to house a memory device;
wherein the memory device comprises a memory device housing wherein the memory device housing is largely rectangular with the width and height of a USB Series A plug standard housing, a connector within the memory device housing, electrical terminals in the memory device housing such that the memory device housing and terminals have a form to connect with the USB Series A receptacle of the electronic device, and a data memory and a controller within the memory device housing, wherein a plurality of components, including the controller and the data memory, is attached to a circuit board, and the circuit board contains a step to locate at least part of the circuit board centrally within the housing to provide space above and below the circuit board, and at least one component is attached to each side of the circuit board; and
wherein the memory device is largely within the receptacle of the portable computing device, and both the receptacle and the memory device have similar or same electrical connection mechanism for electrical connection thereof with the memory device housed in the receptacle.

61. The portable computing device or peripheral of claim 60, wherein said receptacle in the housing comprises a USB series A connector receptacle and wherein said memory device has a form factor to connect with and to reside largely within the USB series A connector receptacle.

62. A memory device for interconnection with a Universal Serial Bus (USB) Series A type receptacle of an electronic device, comprising:
a housing wherein the housing is largely rectangular, with the width and height of a USB Series A plug standard housing;
a connector within the housing;
electrical terminals in the housing;
the housing and terminals of a form to connect with the USB Series A receptacle of the electronic device; and
a data memory and a controller within the housing;
wherein at least one component, including the controller and the data memory, is attached to a circuit board and at least part of the circuit board is in the housing; and
wherein the terminals are attached directly to the circuit board; and
wherein the circuit board has a number of grooves and the respective terminals are positioned in the respective grooves, and wherein the grooves are elongated in an axial direction and the terminals are bowed in a convex curvature generally partially about such axial direction.

63. The memory device according to claim 62, wherein the terminals are connected to conductive paths of the circuit board.

64. A USB style electrical device comprising:
a circuit board having electrical components thereon,
electrical terminals attached to the circuit board providing electrical connection for at least one electrical component,
an electrically conductive housing having an interior in which at least a substantial portion of the circuit board and at least one electrical component are contained, and
stand-offs between the circuit board and the housing positioning the circuit board in the interior of the housing; and
wherein the housing has an entrance to receive a connector and the circuit board having a step to position the electrical terminals to engage terminals of the connector inserted into the housing.

65. The electrical device of claim 64 wherein at least one electrical component is at one surface of the circuit board and at least one electrical component is at the other surface of the circuit board in a space provided between the stand-offs.

66. The electrical device according to claim 64 wherein the stand-offs engage both the interior of the housing and the respective surface of the circuit board.

67. A memory device for interconnection with a Universal Serial Bus (USB) Series A type receptacle of an electronic device, comprising:
a housing wherein the housing is largely rectangular, with the width and height of a USB Series A plug standard housing;
a connector within the housing;
electrical terminals in the housing;
the housing and terminals of a form to connect with the USB Series A receptacle of the electronic device; and
a data memory and a controller within the housing; and wherein at least one component, including the controller and the data memory, is attached to a circuit board, and at least part of the circuit board is located centrally within the housing; and wherein the terminals are attached directly to the circuit board; and wherein the circuit board has a number of grooves and the respective terminals are positioned in the respective grooves, and wherein the grooves are elongated in an axial direction and the terminals are bowed in a convex curvature generally partially about such axial direction.

68. The memory device according to claim 67, wherein the terminals are connected to conductive paths of the circuit board.

* * * * *